(12) United States Patent
Huang et al.

(10) Patent No.: US 7,098,109 B2
(45) Date of Patent: Aug. 29, 2006

(54) MULTI-LEVEL MEMORY CELL AND FABRICATING METHOD THEREOF

(75) Inventors: Chiu-Tsung Huang, Hsinchu (TW); Ko-Hsing Chang, Hsinchu (TW)

(73) Assignee: Powerchip Semiconductor Corp., Hsinchu (TW)

( * ) Notice: Subject to any disclaimer, the term of this patent is extended or adjusted under 35 U.S.C. 154(b) by 0 days.

(21) Appl. No.: 11/160,523

(22) Filed: Jun. 28, 2005

(65) Prior Publication Data
US 2005/0227443 A1    Oct. 13, 2005

Related U.S. Application Data

(62) Division of application No. 10/604,613, filed on Aug. 5, 2003, now Pat. No. 6,943,404.

(51) Int. Cl.
*H01L 21/336* (2006.01)
(52) U.S. Cl. ..................................... 438/287
(58) Field of Classification Search ............... 438/287, 438/288, 266, 267, 142, 197, 216, 257, 261
See application file for complete search history.

(56) References Cited

U.S. PATENT DOCUMENTS 6,706,579 B1 *  3/2004  Kasuya ........................ 438/201
2003/0042531 A1 *  3/2003  Lee et al. .................... 257/315

* cited by examiner

*Primary Examiner*—Lex H. Malsawma
(74) *Attorney, Agent, or Firm*—Jiang Chyun IP Office

(57) ABSTRACT

A multi-level memory cell includes a substrate, an insulation layer, a silicon stripe, a first control gate, a second control gate, source/drain regions, silicon oxide/silicon nitride/silicon oxide composite layers. The insulation layer and the silicon stripe are sequentially disposed on the substrate. The first control gate and the second control gate are respectively disposed on the sidewalls of the silicon stripe, while the source/drain regions are configured in the silicon stripe beside both sides of the first control gate and the second control gate. The composite dielectric layers are disposed between the first control gate and the silicon stripe, and between the second control gate and the silicon stripe. Since a single memory structure can store a multiple bit of information, it is advantageous for minimizing devices.

12 Claims, 8 Drawing Sheets

MULTI-LEVEL MEMORY CELL AND FABRICATING METHOD THEREOF

CROSS-REFERENCE TO RELATED APPLICATION

This application is a divisional of a prior application Ser. No. 10/604,613, filed Aug. 5, 2003 now U.S. Pat. No. 6,943,404.

BACKGROUND OF THE INVENTION

1. Field of Invention

The present invention relates to a memory device and a fabrication method thereof. More particularly, the present invention relates to a multi-level memory cell and a fabrication method thereof.

2. Description of Related Art

A flash memory device provides the property of multiple entries, retrievals and erasures of data. Moreover, the stored information is retained even electrical power is interrupted. As a result, a non-volatile memory device is widely used in personal computers and electronic devices.

This type of erasable and programmable read-only device employs doped polysilicon to fabricate the floating gate and the control gate. When a memory device performs a programming operation, electrons that are injected into the floating gate are evenly distributed in the entire polysilicon floating gate layer. However, the presence of defects in the tunneling oxide layer underneath the polysilicon silicon floating gate would lead to a current leakage of the device, adversely affecting the reliability of the device.

To resolve the current leakage problem of an electrically erasable programmable read-only memory device, the conventional approach is to replace the polysilicon floating gate with a charge trapping layer. The charge trapping layer is, for example, a silicon nitride layer. This type of silicon nitride charge trapping layer is sandwiched by an upper and a lower silicon oxide layer, which forms a stacked gate structure that includes a silicon oxide/silicon nitride/silicon oxide (ONO) composite layer. The EEPROM with this type of stacked gate structure is known as a SONOS read-only memory device. When a voltage is applied to the control gate and the source/drain region of this type of device to perform the programming operation, hot electrons are generated in the channel near the drain region. Since silicon nitride includes the charge trapping characteristics, the charges that are injected into the charge trapping layer are not evenly distributed in the entire charge trapping layer. Instead, these charges are localized in a certain region of the charge trapping layer. Since the charges are localized in a certain region of the charge trapping layer, it is less sensitive to the defects in the tunneling oxide layer. The current leakage problem of the device is thus mitigated.

FIG. 1 is a schematic diagram illustrating the cross-sectional view of a SONOS read-only memory device according to the prior art. Referring to FIG. 1, a SONOS read-only memory cell includes a substrate 100, a composite dielectric layer 102 with a silicon oxide 102a/silicon nitride 102b/silicon oxide 102c structure, a control gate 104, a drain region 106a, a source region 106b and a channel region 108. The silicon oxide 102a/silicon nitride 102b/silicon oxide 102c composite dielectric layer 102 and the control gate 104 are sequentially disposed on the substrate 100 to form a stacked gate structure 110. Further, the channel region is configured in the substrate 100 underneath the stacked gate structure 110, whereas the drain region 106a, the source region 106b are configured in the substrate 100 beside both sides of the stacked gate structure 110.

A higher integration of integrated circuits by further miniaturizing of devices can be achieved by reducing the control gate length of the SONOS memory device. However, as the gate length is being reduced, the underlying channel length is also being reduced. Thus, during the programming of such a memory cell, an abnormal punch through easily occurs between the source region and the drain region, adversely affecting the electrical performance of the memory device.

Further, the application of software by computers has increased tremendously. The capacity of a memory device needs to be increased accordingly. The demands for a small dimension memory device with a large memory capacity thereby increases, which strongly suggests that a modification to the structure and the fabrication method for the conventional SONOS memory device is expected.

SUMMARY OF THE INVENTION

Accordingly, the present invention provides a multi-level memory device and a fabrication method thereof, wherein a single memory cell can store a multiple bits of information to increase the memory capacity of a non-volatile flash memory device.

The present invention also provides a multi-level memory device and a fabrication method thereof, wherein the SONOS memory cell is miniaturized to increase the integration of the device.

The present invention provides a multi-level memory device and a fabrication method thereof, wherein a substrate is already sequentially formed with an insulation layer and a semiconductor layer therein. The semiconductor layer is patterned to form a semiconductive stripe. A first dielectric layer, a charge trapping layer and a second dielectric layer are sequentially formed on the semiconductive stripe. A conductive layer is then formed on the substrate. The conductive layer is patterned to form a conductive stripe, wherein the conductive stripe is perpendicular to the semiconductive stripe. Source/drain regions are then formed in the semiconductive stripe beside both sides of the conductive stripe, followed by forming spacers on the sidewalls of the semiconductive stripe. The semiconductive stripe that is not covered by the spacers is removed to form a first control gate and a second control gate on both sidewalls of the semiconductive stripe.

In the above multi-level memory cell fabrication method, a composite dielectric layer (dielectric layer/charge trapping layer/dielectric layer) and two control gates are formed on the sidewall of the semiconductive stripe. A single memory cell can thereby store a multiple bits of information. Not only the memory capacity of the memory cell is increased, it is also advantageous in miniaturizing devices according to the present invention.

Further, in the steps for forming the first control gate and the second control gate, a self-aligned method is employed to etch the conductive stripe to form the first control gate and the second control gate. Since the photolithography technique is not applied, the manufacturing process is simpler.

The present invention provides a fabrication method for a SONOS memory cell, wherein this method includes providing a silicon-on-insulator substrate. The silicon-on-insulator substrate includes sequentially a substrate, an insulation layer and a silicon layer. Thereafter, the silicon layer is patterned to form a silicon stripe. A silicon oxide/silicon nitride/silicon oxide layer is formed on the silicon stripe. A conductive layer is further formed on the silicon-on-insulator substrate. The conductive layer is then patterned to form a conductive stripe, wherein the conductive stripe is perpendicular to the silicon stripe. Thereafter, the composite dielectric layer not covered by the conductive stripe is removed. Source/drain regions are then formed in the silicon stripe beside both sides of the conductive stripe. Spacers are then formed on the sidewalls of the silicon stripe. The conductive stripe not covered by the spacer is further removed to form a first control gate and a second control gate beside both sidewalls of the silicon stripe.

In the above fabrication method for a multi-level SONOS memory cell, a silicon oxide/silicon nitride/silicon oxide layer and two control gates are formed on the sidewall of the silicon stripe. A single memory cell can thereby store a multiple bits of information. Not only the memory capacity of the memory cell is increased, it is also advantageous for miniaturizing devices according to the present invention.

Further, in forming the first control gate and the second control gate, a self-aligned method is used to etch the conductive stripe to form a first control gate and a second control gate. Since the photolithography technique is not used, the manufacturing process is simpler.

The present invention provides a multi-level memory cell. This multi-level memory cell includes a substrate, an insulation layer, a semiconductive stripe, a first control gate, a second control gate, source/drain regions, a charge trapping layer, a first dielectric layer, a second dielectric layer. The insulation layer and the semiconductive stripe are sequentially disposed on the substrate. The first control gate and the second control gate are each respectively disposed on the sidewalls of the semiconductive stripe. Further, the charge trapping layer is disposed between the first control gate and the semiconductive stripe and between the second control gate and the semiconductive stripe. Moreover the first dielectric layer is disposed between the charge trapping layer and the semiconductive stripe, while the second dielectric layer is disposed between the first control gate and the charge trapping and between the second control gate and the charge trapping layer.

According to the above memory cell, a vertical type of read-only memory cell is configured on a substrate, wherein a composite dielectric layer (dielectric layer/electron trapping layer/dielectric layer) and two control gates are disposed on the sidewalls of the semiconductive stripe. A single memory cell can thereby store a multiple bits of information. Not only the memory capacity of the memory cell is increased, it is also advantageous for miniaturizing devices according to the present invention.

The present invention provides a multi-level SONOS memory cell, wherein this multi-level memory cell includes a silicon-on-insulator substrate, a first control gate, a second control gate, source/drain regions and a silicon oxide/silicon nitride/silicon oxide layer. The silicon-on-insulator substrate also has an insulation layer and a silicon stripe thereon. The first control gate and the second control gate are respectively disposed on the sidewall of the silicon stripe, whereas the source/drain regions are disposed in the silicon stripe beside both sides of the first control gate and the second control gate. Further, the silicon oxide/silicon nitride/silicon oxide layer is disposed between the first control gate and the silicon stripe and between the second control gate and the silicon stripe.

In the above multi-level SONOS memory cell, a vertical type of read-only memory cell is configured on a substrate, wherein a composite dielectric layer (dielectric layer/electron trapping layer/dielectric layer) and two control gates are disposed on the sidewalls of the semiconductive stripe. A single memory cell can thereby store a multiple bits of information. Not only the memory capacity of the memory cell is increased, it is also advantageous for miniaturizing devices according to the present invention.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

FIG. 3A to 3E are schematic, cross-sectional views illustrating a process flow for fabricating a multi-level memory cell according to one aspect of the present invention, wherein FIGS. 3A to 3E are cross-sectional views of FIGS. 2A to 2E along the cutting line I–I'.

FIG. 5 is a cross-sectional view of a multi-level memory cell according to one aspect of the present invention, wherein FIG. 5 is a cross-sectional view of FIG. 4 along the cutting line I–I'.

DESCRIPTION OF THE PREFERRED EMBODIMENTS

FIGS. 2A to 2E are schematic, three-dimensional views illustrating a process flow for fabricating a multi-level memory cell according to one aspect of the present invention. FIG. 3A to 3E are schematic, cross-sectional views illustrating a process flow for fabricating a multi-level memory cell according to one aspect of the present invention, wherein FIGS. 3A to 3E are cross-sectional views of FIGS. 2A to 2E along the cutting line I–I'.

Figure 1:
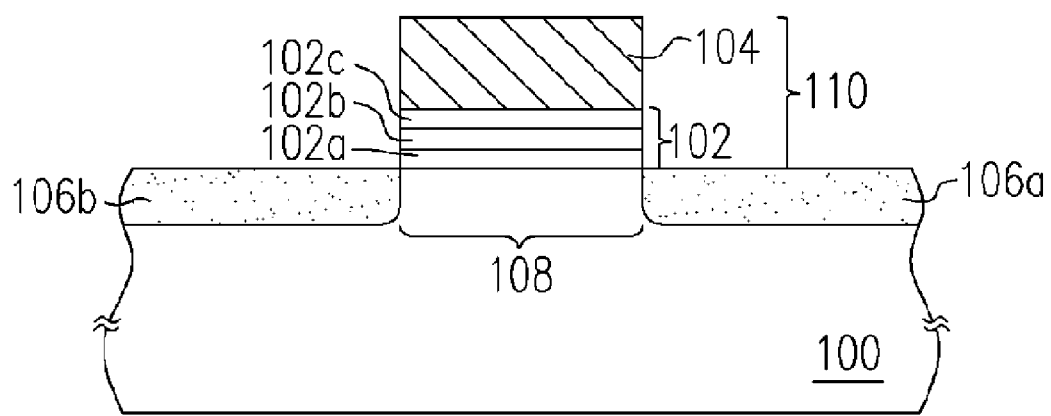
FIG. 1 is a schematic, cross-sectional view illustrating a conventional SONOS read-only memory cell.
Figure 2A:
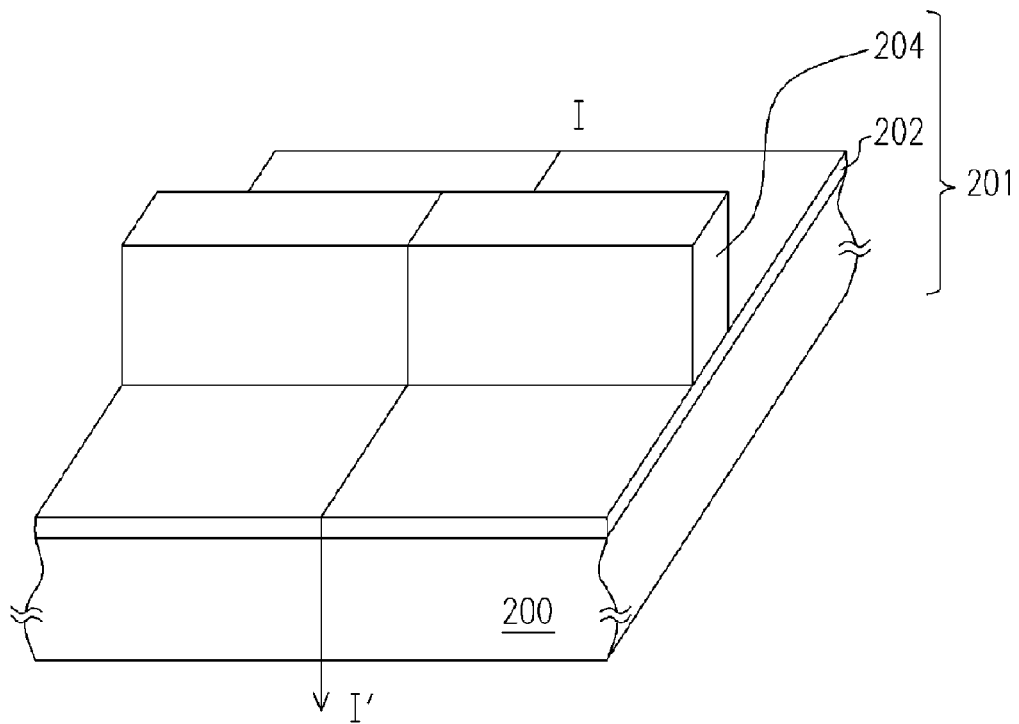
FIGS. 2A to 2E are schematic, three-dimensional views illustrating a process flow for fabricating a multi-level memory cell according to one aspect of the present invention.
Figure 3A:
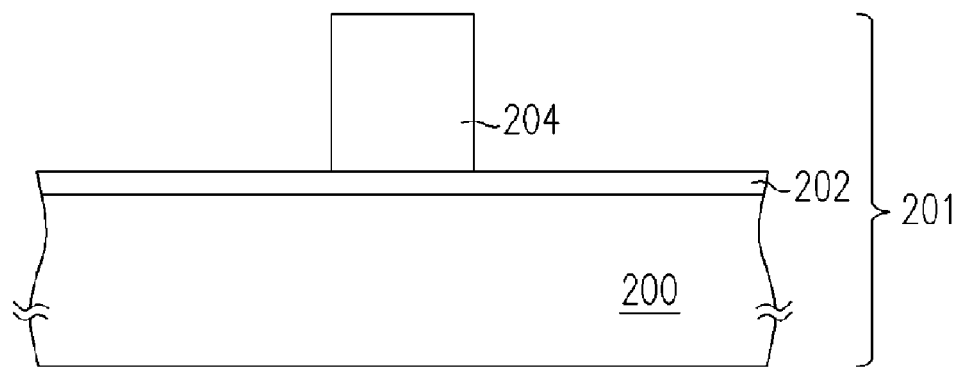

Referring to FIG. 2A and FIG. 3A concurrently, a P-type silicon-on-insulator substrate 201 is provided. This silicon-on-insulator substrate 201 includes a substrate 200, an insulation layer 202 and a semiconductor layer (not shown), wherein the insulation layer 202 of the silicon-on-insulator substrate 201 is used to isolate the substrate 200 and the semiconductor layer. Thereafter, the semiconductor layer is patterned to define the active region, in other words, to form a semiconductive stripe 204. One point that is worth noting is that the following disclosure of the present invention is based on silicon-on-insulator substrate 201. Of course, beside directly providing a silicon-on-insulator substrate 201, a substrate, for example, a silicon substrate can be first provided, followed by forming sequentially an insulation layer and a semiconductor layer, wherein the insulation layer is formed with, for example, silicon oxide, while the semiconductor layer is formed with, for example, silicon.

Figure 2B:
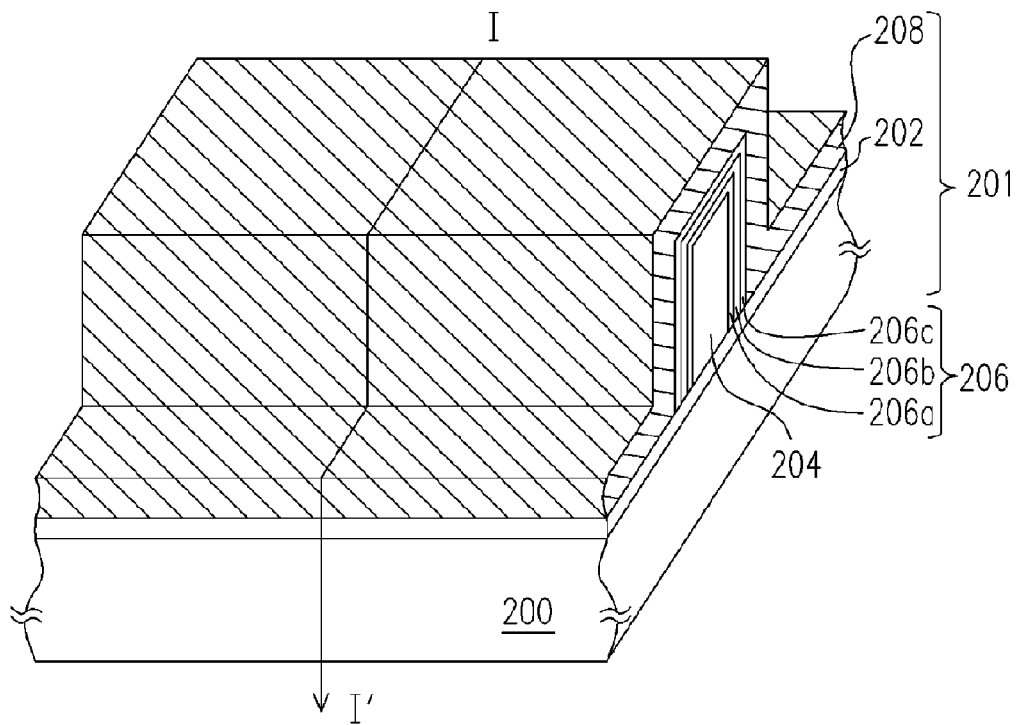
Figure 3B:
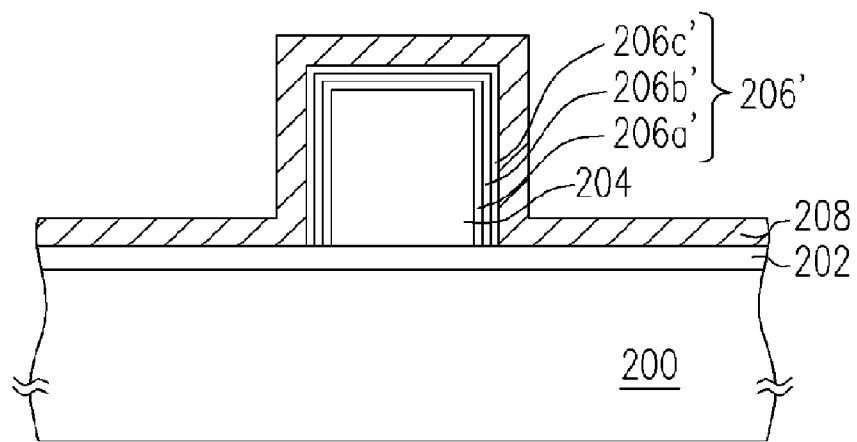

Referring to FIGS. 2B and 3B, a composite dielectric layer 206 is formed over the semiconductive stripe 204, wherein this composite dielectric layer 206 is formed with, for example, a dielectric layer 206a, a charge trapping layer 206b, a dielectric layer 206c. The dielectric layer 206a is, for example, a silicon oxide material, which serves as a tunneling dielectric layer. The charge trapping layer 206b is, for example, a silicon nitride material, which serves to trap charges. The charge trapping layer 206b, of course, can be any material that can trap charges. The dielectric layer 206c is, for example, a silicon oxide material, which serves to isolate the charge trapping layer 206b and the subsequently formed control gate. The composite dielectric layer is formed by, for example, forming a silicon oxide layer over the semiconductive stripe 204 using a thermal oxidation method, followed by forming a silicon nitride layer over the silicon oxide layer by a chemical vapor deposition method, and further followed by forming a silicon oxide layer over the silicon nitride using a chemical vapor deposition method. A conductive layer 208 is further formed on the silicon-on-insulator substrate 201. This conductive layer 208 is, for example, a doped polysilicon material, wherein forming the conductive layer 208 includes performing a chemical vapor deposition method to form an undoped polysilicon layer, followed by performing an ion implantation process.

Figure 2C:
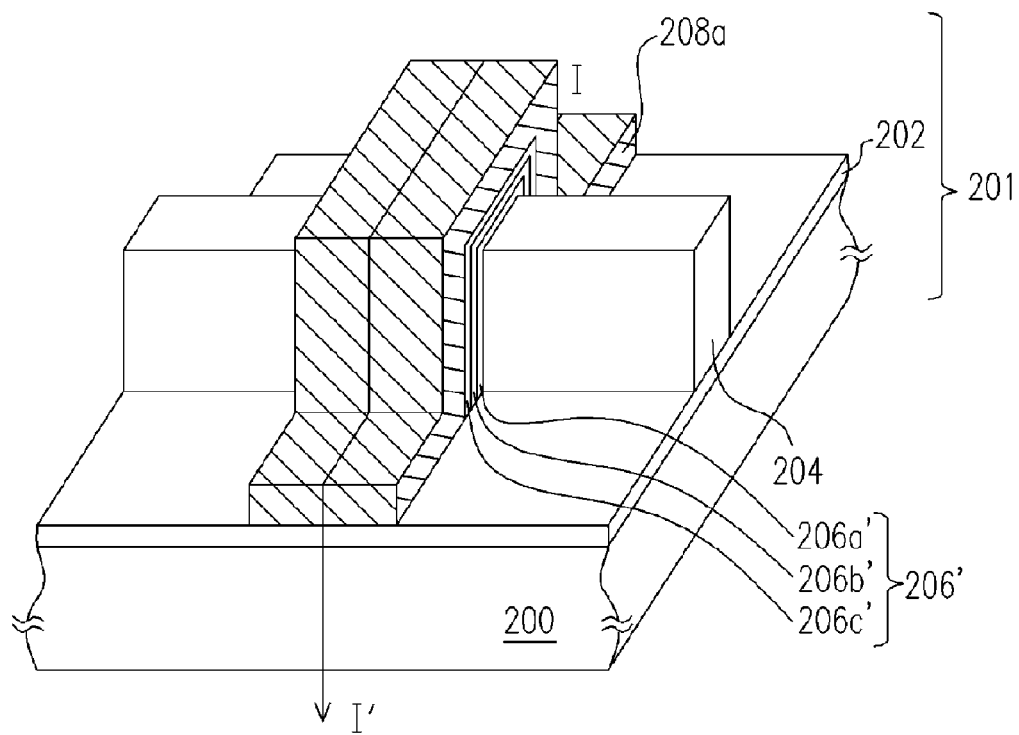
Figure 3C:
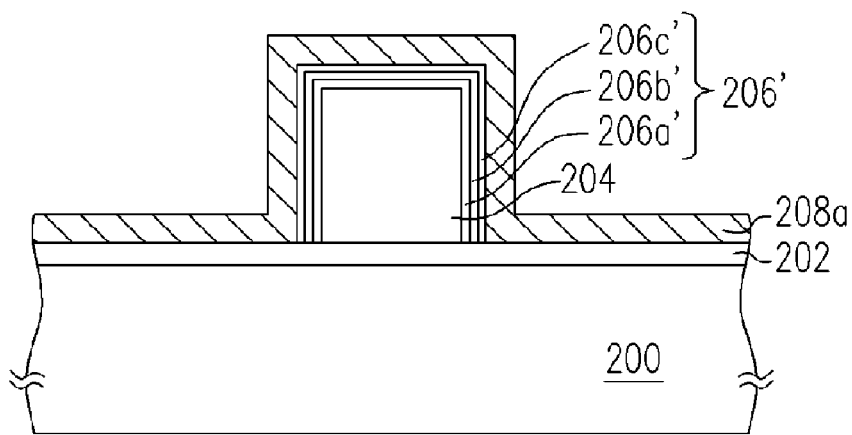

Thereafter, referring to FIGS. 2C and 3C, the conductive layer 208 is patterned to form a conductive stripe 208a, wherein the conductive strip 208a is perpendicular to the semiconductive stripe 204. Thereafter, the composite dielectric layer 206 not covered by the conductive stripe 208a is removed to form a composite dielectric layer 206', wherein removing the composite layer 206 is by, for example, an etching process, such as, a dry etching process.

Figure 2D:
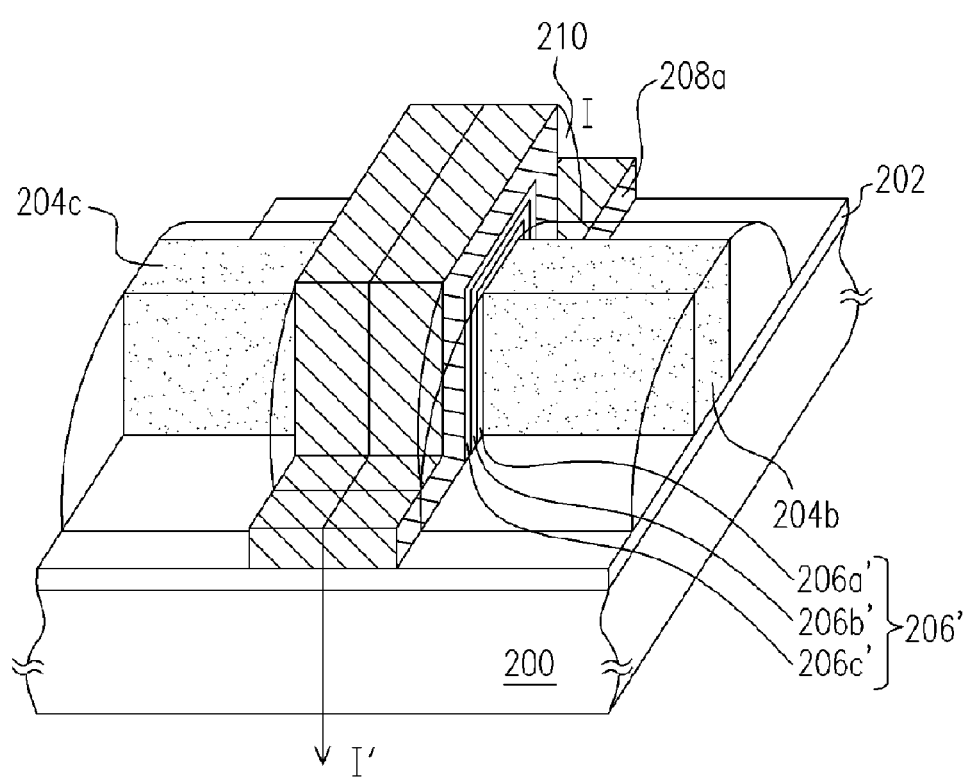
Figure 3D:
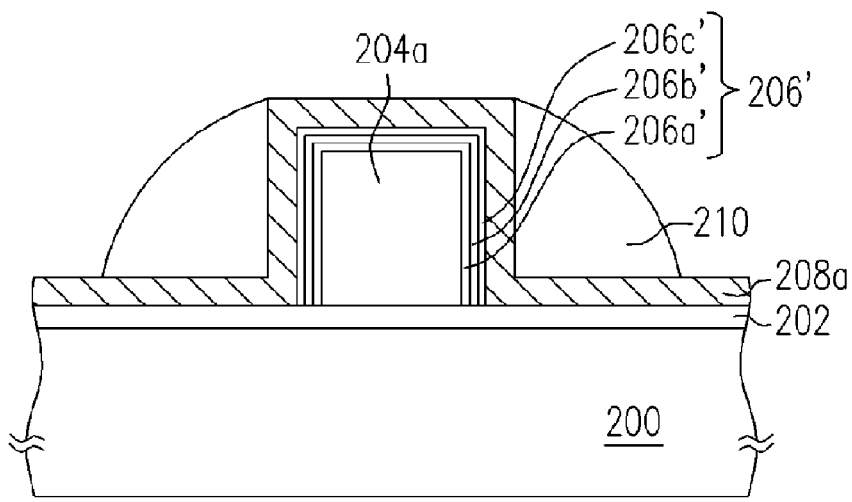

Continuing to FIGS. 2D and 3D, a source region 204b and a drain region 204c are formed in the semiconductive stripe 204 beside both sides of the conductive stripe 208a. The source region 204b and the drain region 204c are formed by, for example, an ion implantation method. In this process step, different conductive types and different types of dopants can be implanted depending on the type of memory device is being desired. Further, as shown in FIG. 3D, the undoped conductive stripe 204, which is under the composite dielectric layer 206' is defined as the channel region 204a in a subsequent process. Thereafter, spacers 210 are formed on sidewalls of the semiconductive stripe 204, covering also the conductive stripe that is on the sidewalls of the semiconductive stripe 204. The spacers 210 are, for example silicon oxide, formed by chemical vapor deposition, using, for example, tetra ethyl ortho silicate (TEOS)/ozone as a reacting gas source. This spacer 210 is formed by, for example, forming an insulation material layer (silicon oxide) on the substrate 200, followed by an anisotropic etching process.

Figure 2E:
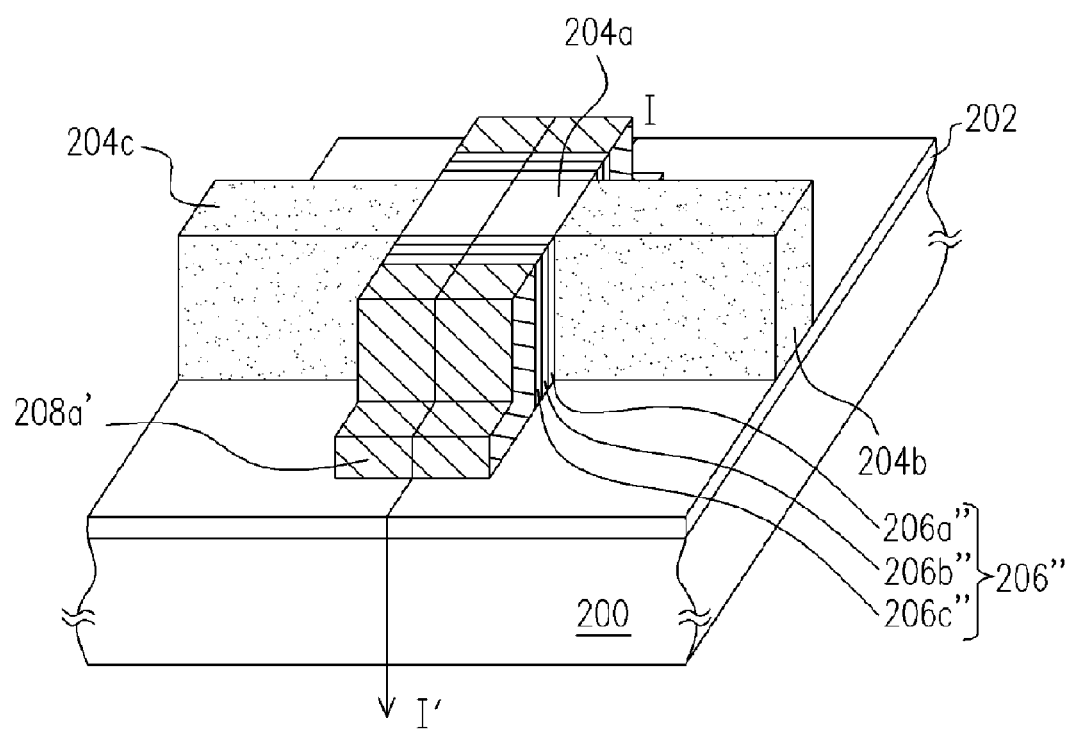
Figure 3E:
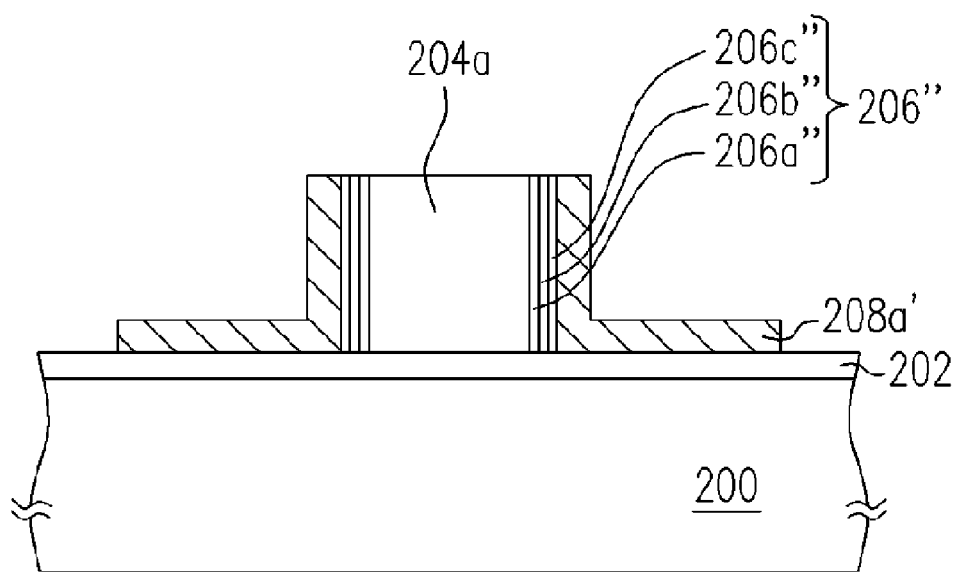

Referring to FIG. 2E and 3E, the conductive stripe 208a, not covered by the spacer, is removed to form two control gates 208a on the sidewall of the channel region 204a. After removing the conductive stripe 208a not covered by the spacer, the underlying composite dielectric layer 206' is also removed using the spacer as a mask, leaving only the composite dielectric layer 206" disposed between the control gate 208a' and the semiconductive stripe 204. The spacer 210 is further removed. The subsequent manufacturing step to complete the fabrication of a read-only memory cell is well known to those skilled in the art.

In accordance to the manufacturing method of the present invention, in the fabrication step for the control gate, a self-aligned method is adopted by using the spacer as a mask to etch the conductive stripe to form two control gates. Since the photolithography technique is not used, the manufacturing process is simpler.

Moreover, in accordance to the present invention, a composite dielectric layer (dielectric layer/charge trapping layer/dielectric layer) and two control gates are formed on the sidewalls of the semiconductive stripe. During the programming operation, two charge trapping layers can concurrently stored with electrons, or only one charge trapping layer is stored with charges or none of the two charge trapping layers is stored with charges. A single memory cell thereby can store a multiple bit of information. Not only the memory capacity of the memory cell is increased, it is also advantageous for miniaturizing devices according to the present invention.

Figure 4:
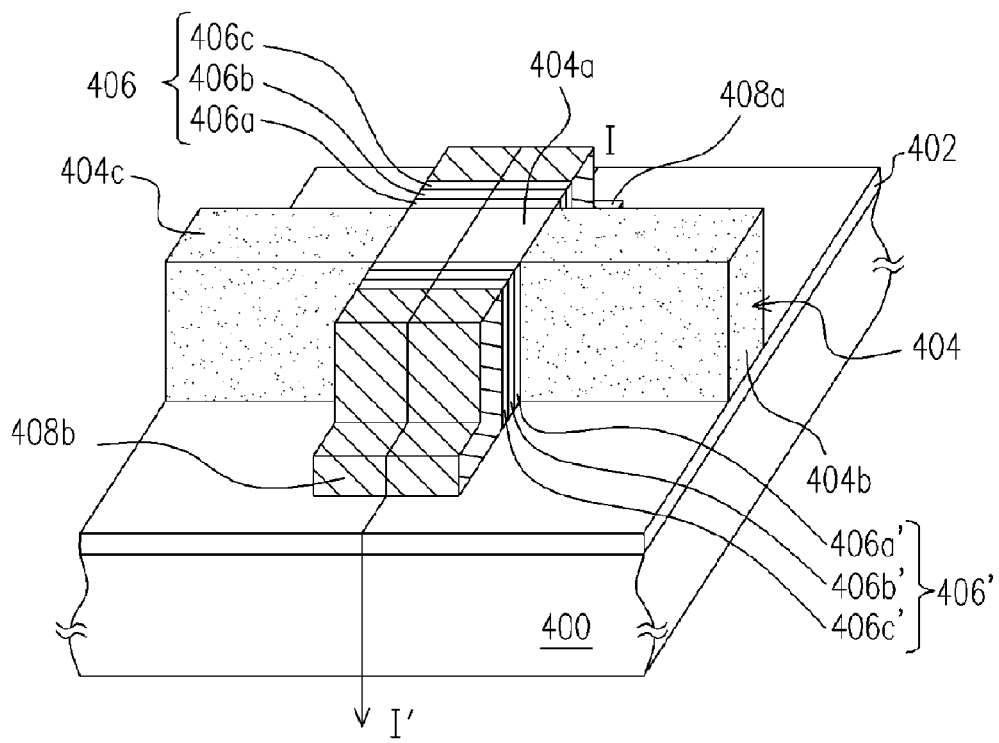
FIG. 4 is a three-dimensional view of a multi-level memory cell according to one aspect of the present invention.
Figure 5:
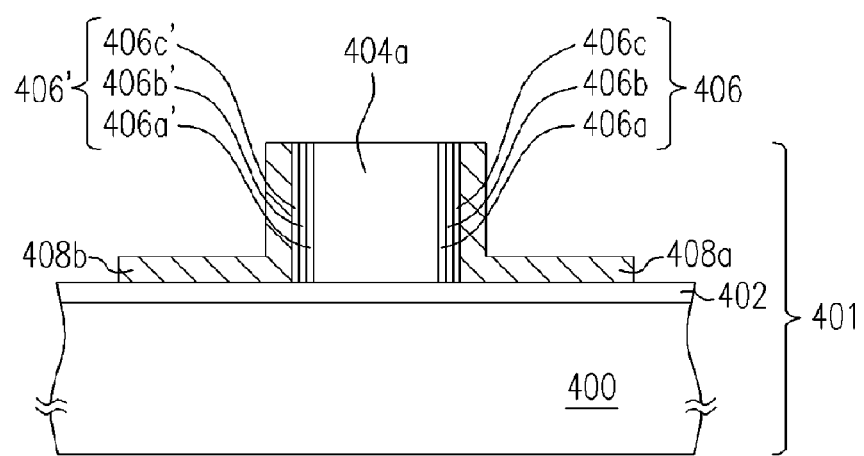

FIG. 4 is a three-dimensional view of a multi-level memory cell according to one aspect of the present invention. FIG. 5 is a cross-sectional view of a multi-level memory cell according to one aspect of the present invention, wherein FIG. 5 is a cross-sectional view of FIG. 4 along the cutting line I–I'.

Referring to both FIG. 4 and FIG. 5, FIGS. 4 and 5 are used to illustrate the multi-level memory cell of the present invention. This multi-level memory cell includes a substrate 400, an insulation layer 402, a semiconductive stripe 404, two control gates 408a, 408b, a source region 404b, a drain region 404c and two composite dielectric layers 406, 406'.

The insulation layer 402 and the semiconductive stripe 404 are sequentially disposed on the substrate 400. Further the insulation layer 402 is, for example, a silicon oxide material, whereas the semiconductive strip 404 is, for example, a silicon material. Further, the substrate 400, the insulation layer 402 and the semiconductive stripe 404 constitute a silicon-on-insulator (SOI) substrate 401, wherein the insulation layer 402 in the SOI substrate 401 is used to isolate the substrate 400 and the semiconductive stripe 404.

The control gates (408a, 408b) are respectively disposed on the sidewalls of the composite dielectric layer (406, 406'), wherein the control gates (408a, 408b) are formed with doped polysilicon.

The source region 404b and the drain region 404c are configured in the semiconductive stripe 494 beside both sides of the control gates (408a, 408b). Further, the conductive stripe 404 that is between the source region 404b and the drain region 404c serves as the channel region 404a.

The composite dielectric layers (406, 406') are disposed on two sides of the semiconductive stripe 404 and in between the semiconductive stripe 404 and the control gates (408a, 408b). The composite dielectric layers (406, 406') includes the dielectric layers (406a, 406a'), the charge trapping layers (406b, 406b'), and the dielectric layers (406c, 406c'). The dielectric layers (406a, 406a') are, for example, a silicon oxide material, and are used as the tunnel oxide layer. The charge trapping layers (406b, 406b') are, for example, a silicon nitride material, and are used for trapping charges. The dielectric layers (406c, 406c') are, for example, a silicon oxide material, and are used to isolate the charge trapping layer (406b, 406b') and the control gates 408a, 408b, respectively.

According to the present invention, a vertical type of read-only memory cell is configured over a substrate. In other words, two control gates and the composite dielectric layer (dielectric layer/charge trapping layer/dielectric layer) are disposed on the sidewalls of the semiconductive stripe. During the programming operation, two charge trapping layer can concurrently stored with electrons, or only one charge trapping layer is stored with charges or none of the two charge trapping layer is stored with charges. A single memory cell thereby can store a multiple bit of information. Not only the memory capacity of the memory cell is increased, it is also advantageous for miniaturizing devices.

Moreover, the programming operation of the multi-level memory cell of the present invention can be modified by applying a voltage to the control gate and the source/drain regions beside both sides of the control gate to store two groups of electrons, a single group of electrons or no electrons in a single charge trapping layers (406b, 406b'). Using the multi-level memory cell shown in FIG. 4 as an example, to program this memory cell, a higher voltage is applied to the drain region 404c at one side of the control gate 408a (or 408b). Electrons are stored in the charge trapping layer 406b (or 406b') near the side of the drain region 404c. A higher voltage can also be applied to the source region 404b at another side of the control gate 408a (or 408b) in order for charges to store in the charge trapping layer 406b (or 406b') at another side of the source region 404b. Therefore, with a single control gate 408a (or 408b) and the charge trapping layer 406b (or 406b') in between the control gate 408a (or 408b) and the semiconductive stripe 404, the memory cell can be programmed into four different states.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method for manufacturing a multi-level SONOS memory cell, comprising:
    providing a silicon-on-insulator (SOI) substrate, wherein the SOI substrate comprises a substrate, an insulation layer and a silicon layer;
    patterning the silicon layer to form a silicon stripe;
    forming a composite dielectric layer over the silicon stripe, wherein the composite dielectric layer is a silicon oxide/silicon nitride/silicon oxide layer, and the composite dielectric layer covers a top part and two sidewalls of the silicon stripe;
    forming a conductive stripe over the SOI substrate, wherein the conductive stripe is perpendicular to the silicon stripe;
    removing the composite dielectric layer not covered by the conductive stripe;
    forming source/drain regions in the silicon stripe beside two sides of the conductive stripe;
    forming spacers on the sidewalls of the silicon stripe and the overlapping portion of the conductive stripe and the silicon stripe; and
    removing the conductive stripe not cover by the spacers to form a first control gate and a second control gate on the two sidewalls of the silicon stripe.

2. The method of claim 1, wherein after the step of removing the conductive stripe, the composite dielectric layer above the silicon stripe is removed.

3. The method of claim 1, wherein the step of removing the conductive stripe further comprises removing the spacers.

4. The method of claim 1, wherein the step of forming the source/drain regions comprises performing ion implantation.

5. The method of claim 1, wherein the step of forming the composite layer over the silicon stripe further comprises:
    forming a first silicon oxide layer over the silicon stripe by thermal oxidation;
    forming a silicon nitride layer over the first oxide layer by chemical vapor deposition; and
    forming a second silicon oxide layer over the silicon nitride layer by chemical vapor deposition.

6. A method for manufacturing a multi-level memory cell, comprising:
    providing a substrate;
    forming sequentially over the substrate, an insulation layer and a semiconductor layer above the insulation layer;
    patterning the semiconductor layer to form a semiconductive stripe;
    forming a first dielectric layer over the semiconductive stripe;
    forming a charge trapping layer over the first dielectric layer;
    forming a second dielectric layer over the charge trapping layer;
    forming a conductive layer over the substrate;
    patterning the conductive layer to form a conductive stripe, wherein the conductive stripe and the semiconductive stripe are perpendicular to each other;
    forming source/drain regions in the semiconductive stripe beside two sides of the conductive stripe;
    forming spacers on sidewalls of the semiconductive stripe and the overlapping portion of the conductive stripe and the semiconductive stripe; and
    removing the conductive stripe not covered by the spacer to form a first control gate and a second control gate on the sidewalls of the semiconductive stripe.

7. The method of claim 6, wherein the step of removing the conductive stripe further comprises removing the first dielectric layer, the charge trapping layer and the second dielectric layer above the semiconductive stripe.

8. The method of claim 6, wherein the step of removing the conductive stripe comprises removing the spacers.

9. The method of claim 6, wherein the step of forming the source/drain regions further comprises performing ion implantation.

10. The method of claim 6, wherein the semiconductor layer is a silicon layer.

11. The method of claim 6, wherein the conductive layer is a polysilicon layer.

12. The method of claim 6, wherein the charge trapping layer comprises a silicon nitride layer.

* * * * *